United States Patent [19]
Kojima

[11] Patent Number: 5,348,012
[45] Date of Patent: Sep. 20, 1994

[54] MAGNETIC RESONANCE IMAGING APPARATUS AND METHOD FOR FORMING AN IMAGE OF AN ARTERY

[75] Inventor: Fumitoshi Kojima, Ootawara, Japan

[73] Assignee: Kabushiki Kaisha Toshiba, Kawasaki, Japan

[21] Appl. No.: 21,516

[22] Filed: Feb. 23, 1993

[30] Foreign Application Priority Data

Feb. 26, 1992 [JP] Japan .................................. 4-039011

[51] Int. Cl.$^5$ ............................................. A61B 5/055
[52] U.S. Cl. .................................. 128/653.3; 324/306
[58] Field of Search .......................... 128/653.3, 653.2; 324/306, 309

[56] References Cited

U.S. PATENT DOCUMENTS 4,947,837 8/1990 Sano et al. ...................... 128/653.3

Primary Examiner—Ruth S. Smith
Attorney, Agent, or Firm—Limbach & Limbach

[57] ABSTRACT

A gradient field is applied in a coronal scheme such that a slice region along the flowing direction of a blood vessel, i.e., along the body axis is set as an imaging area. Of regions adjacent to the imaging region in the body axis direction, a region including a blood vessel as a target of imaging (in this case, an artery) through which the blood flows toward the imaging region is not excited, but only the imaging region is selectively excited. Then, since a spin in the artery is supplied to the imaging region in a fresh state, the image of this spin is formed with a signal level higher than that of a stationary spin remaining in the imaging region. Since the presaturated blood in the artery in the imaging region is returned at its peripheral portion to flow through the vein, the spin in the vein is already saturated, its signal level is lower than that of the spin in the artery, and the image of this spin is not formed. As a result, the image of the state of the artery can be formed within a short period of time.

9 Claims, 3 Drawing Sheets

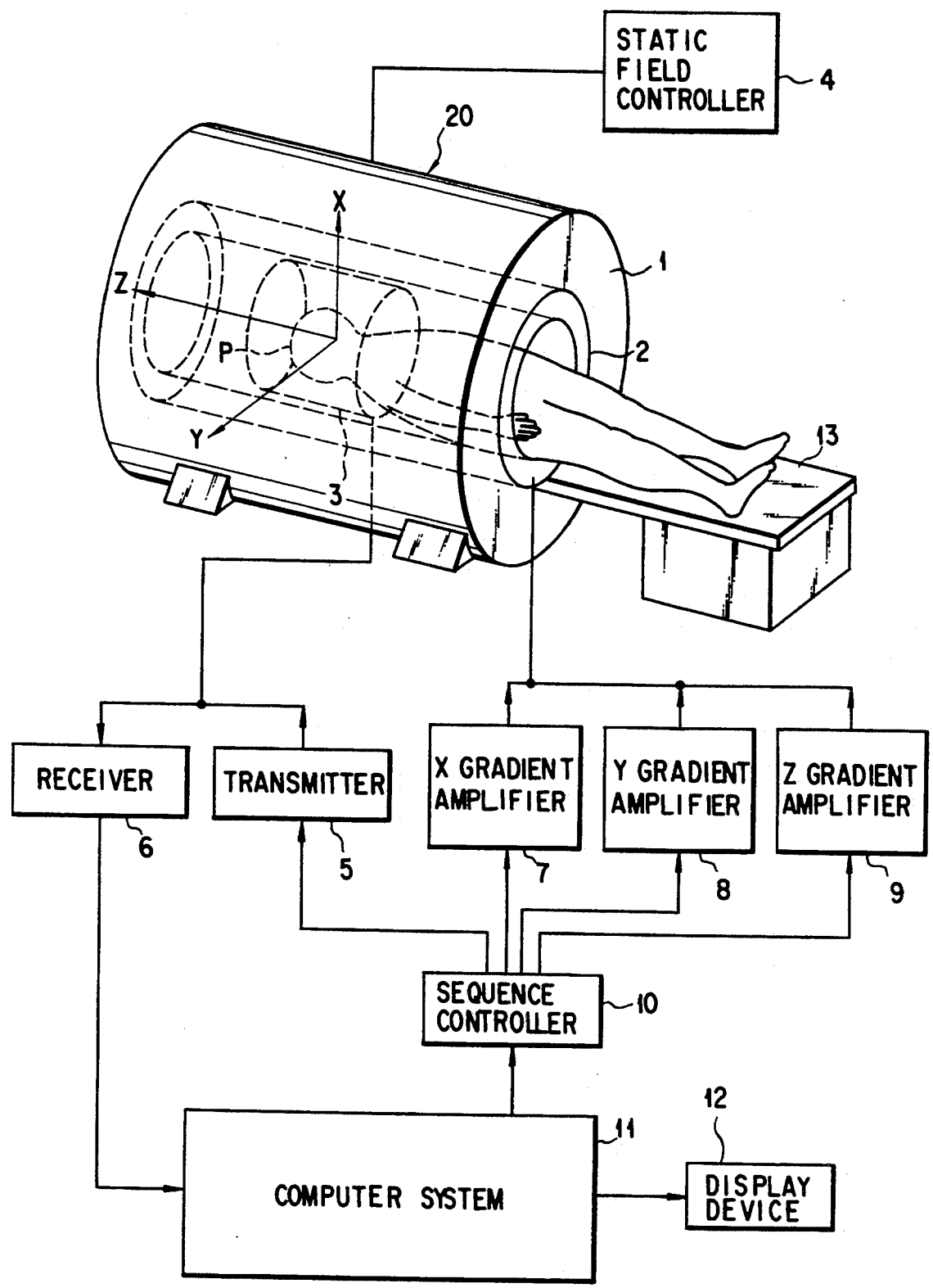
F I G. 2

MAGNETIC RESONANCE IMAGING APPARATUS AND METHOD FOR FORMING AN IMAGE OF AN ARTERY

Background of the Invention

1. Field of the Invention

The present invention relates to a magnetic resonance imaging apparatus for forming an image of the state of an artery in accordance with MR angiography.

2. Description of the Related Art

Recently, MR angiography for forming an image of blood flow has been developed. In magnetic resonance imaging, one of the phenomena caused by the blood flow is the TOF (Time Of Flight) phenomenon. When spins in a fluid outside an imaging region are flowed into the imaging region, a signal having a different level than a signal induced from stationary spins is detected. In the imaging region, RF pulses are applied to the stationary spins a number of times so that the spins are saturated and the signal level is lowered. The level difference is enhanced if the spins in the outside region are presaturated. This phenomenon is called the TOF phenomenon.

Normally, a slice (imaging region) is set to be perpendicular to the axis of the body to obtain a sufficient TOF effect. Therefore, blood vessels intersect the imaging region. Since an RF pulse is repeatedly applied to the imaging region, the signal intensity of the stationary spin remaining in the imaging region is decreased by a certain degree by saturation. However, when blood flow in the imaging region is considered, by fresh spins being successively supplied from a non-saturated region outside the selected excitation region (imaging region), a spin in the blood vessel has a higher signal level than that of a stationary spin in the imaging region. Therefore, when this TOF phenomenon is utilized, an image is obtained in which the stationary portion is weakened and the blood flow is enhanced.

Furthermore, when a presaturation pulse is applied to a region adjacent to the imaging region, the signal level of the spin in the blood vessel flowing into the imaging region can be decreased to almost zero. This presaturation technique is known as the BFAST scheme. A case wherein the image of only an artery is to be formed in accordance with the BFAST scheme will be described with reference to FIG. 1. FIG. 1 shows a case wherein an upper thigh of a human body is to be imaged. Of the two side regions adjacent to an imaging region 42, the region in which the blood flows in veins toward the imaging region 42, is defined as a presaturation region 44. In the imaging region, though the blood in arteries has many unsaturated fresh spins, spins in the veins are saturated by presaturation and signals are scarcely generated by these spins in the vein. Hence, in an image based on magnetic resonance signals acquired from spins in the imaging region 42, the interiors of the veins and portions other than the blood vessels do not appear, and formation of images of only the arteries is theoretically possible.

With the BFAST scheme, however, the presaturated spins must pass through the imaging region 42 before they are recovered to the unsaturated state. For this purpose, the width (i.e., the length along the blood flow) of the presaturation region 44 must be determined in accordance with the width of the imaging region and the rate of the blood flow. However, it is difficult to accurately know the rate of the blood flow. Therefore, it is actually impossible to optimize the width of the presaturation region 44, and extraction of only the arteries image is impossible. In addition, since the rate of the blood flow is changed by pulsation, in order to cope with this change, flow compensation must be performed by prolonging the echo time. However, an imaging time is preferably short. Thus, if flow compensation is not performed by shortening the echo time, it can be erroneously determined that the blood vessel in a bent portion is occluded. Since the blood vessel appears discontinuous at this portion, it is difficult to extract a bent blood vessel.

Another example of angiography is phase compensation method. However, when flow compensation is performed in the phase compensation method, the repetition time is undesirably prolonged.

In this manner, the conventional MR angiography has various drawbacks such that it is difficult to extract only artery or a bent blood vessel image, and the imaging time is long.

SUMMARY OF THE INVENTION

The present invention has been made in view of the above situation, and has as its object to provide a magnetic resonance imaging apparatus capable of forming an accurate image of the state of an artery within a short period of time.

According to the present invention, there is provided a magnetic resonance imaging apparatus for setting a slice region along the flowing direction of an artery as an imaging region, radiating a radio-frequency pulse at a frequency to excite; only spin in the imaging region and not outside thereof, and forming an image of the imaging region on the basis of a magnetic resonance signal generated by the spin in the imaging region.

According to the magnetic resonance imaging apparatus of the present invention, since the region along the flowing direction of the artery is imaged, the number of imaging slices for blood vessel imaging is minimized. As a result, the imaging time can be shortened, and the post-processing time is also shortened. Since the spins in an artery through which the blood flows toward the imaging region is not excited, the artery image can be reliably extracted. Therefore, even when the blood flow rate is changed or the blood vessel is more or less bent, the blood vessel image can be continuously extracted, and the resolution of the image is improved.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 2 is a block diagram showing the arrangement of a magnetic resonance imaging apparatus according to an embodiment of the present invention;

DETAILED DESCRIPTION OF THE PREFERRED EMBODIMENTS

Figure 1:
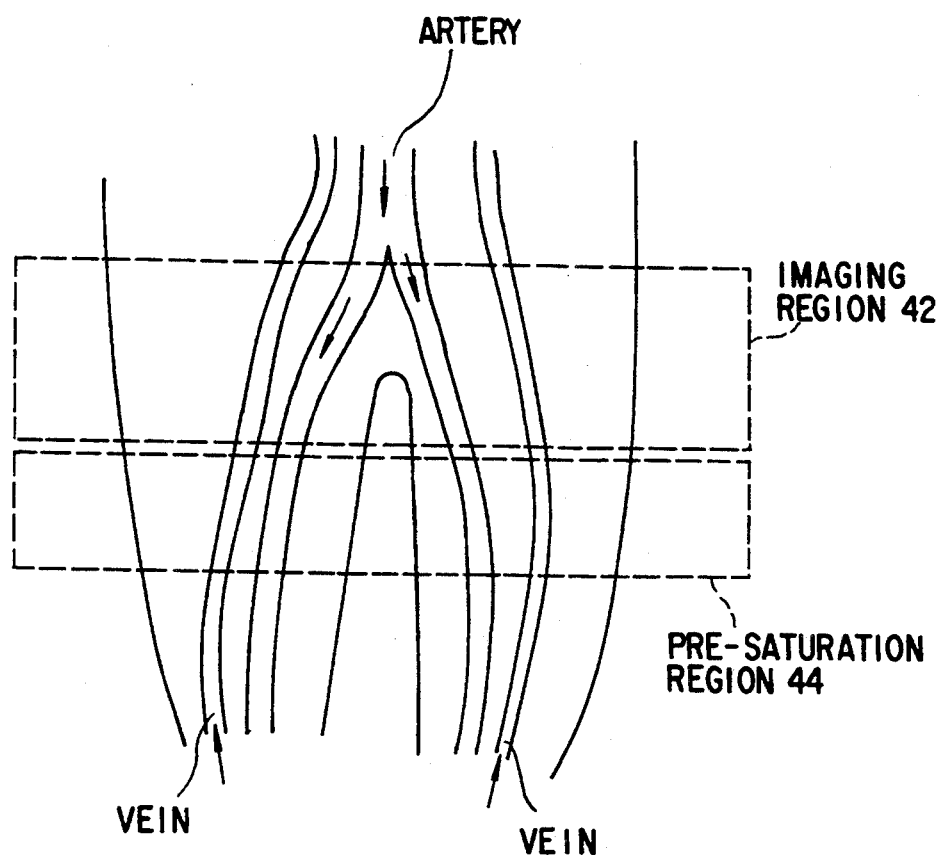
FIG. 1 is a view for explaining the principle of MR angiography in accordance with the BFAST scheme.

A preferred embodiment of a magnetic resonance imaging apparatus according to the present invention will now be described with reference to the accompanying drawings. Referring to Fig. 2, there is illustrated a magnetic resonance imaging apparatus of the present invention in block form. A static magnetic field forming magnet 1, an x-axis, y-axis, and z-axis gradient magnetic fields forming coil system 2, and a transmitter/receiver coil system 3 are installed in a gantry 20. The transmitter/receiver coil 3 may be directly attached to a human body P under examination instead of being embedded in the gantry.

The magnet 1, serving as a means of forming a static magnetic field, can be constructed of a superconducting or normal-conducting coil. The x-axis, y-axis, and z-axis gradient fields forming coil system 2 is adapted to generate an x-axis gradient field Gx, a y-axis gradient field Gy, and a z-axis gradient field Gz. The transmitter/receiver coil 3 emits a radio-frequency (RF) pulse serving as a selective excitation pulse for selecting a slice to be imaged of the human body P and detects a magnetic resonance signal (echo signal) generated by magnetic resonance induced in the selected slice. The human body P, laid down an examination couch 13, is allowed to have access to the imaging space within the gantry 20. The imaging space is a spherical space in which imaging magnetic fields are formed, and imaging diagnosis can be made only when an imaging portion of the human body lies within this space.

The static magnetic field forming magnet 1 is driven by a static field controller 4. The transmitter/receiver coil 3 is coupled to a transmitter 5 at the time of inducing magnetic resonance in the human body and to a receiver 6 at the time of detecting magnetic resonance signals from the human body. The x-axis, y-axis, and z-axis gradient fields forming coil system 2 is driven by x-axis, y-axis, and z-axis gradient field power supplies (amplifiers) 7, 8, and 9.

The x-axis, y-axis, and z-axis gradient field amplifiers 7, 8, and 9, and the transmitter 5 are driven by a sequence controller 10, thereby generating an x-axis gradient field Gx, a y-axis gradient field Gy, a z-axis gradient field Gz, and a radio-frequency (RF) pulse in accordance with a predetermined pulse sequence. Here, RARE (Rapid Acquisition with Relaxation Enhancement) imaging sequence is used, which is described in Magnetic Resonance in Medicine 3,823–833 (1986). In this case, the gradient fields Gx, Gy, and Gz are used as a phase-encoding gradient field Ge, a slice-selection gradient field Gs, and a read-out gradient field Gr, respectively. This method of applying gradient fields is called coronal scheme. In the axial scheme, the gradient fields Gx, Gy, and Gz are used as a phase-encoding gradient field Ge, a read-out gradient field Gr, and a slice-selection gradient field Gs, respectively. A computer system 11 drives and controls the sequence controller 10 and receives magnetic resonance signals from the receiver 6 for signal processing, thereby reconstructing a cross-sectional magnetic resonance (MR) image of the human body and displaying it on a display device 12.

Figure 3:
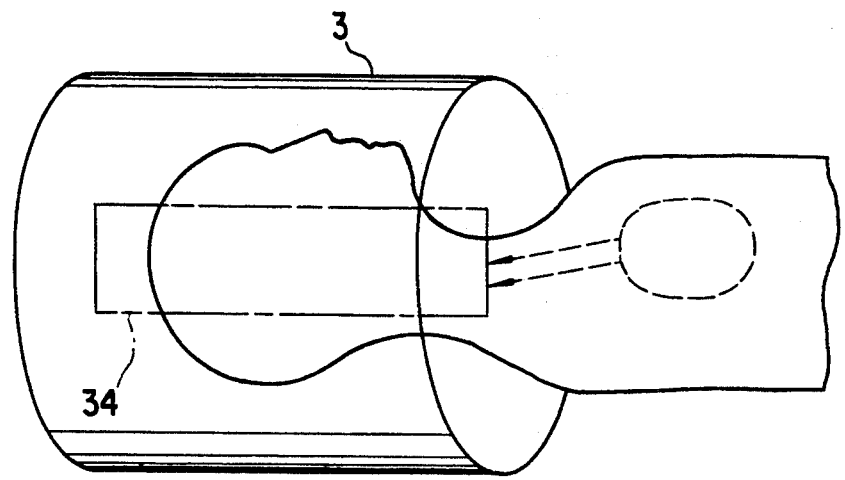
FIG. 3 is a view showing the relationship between the shape of a transmitter/receiver coil of the embodiment and an imaging region.
Figure 4:
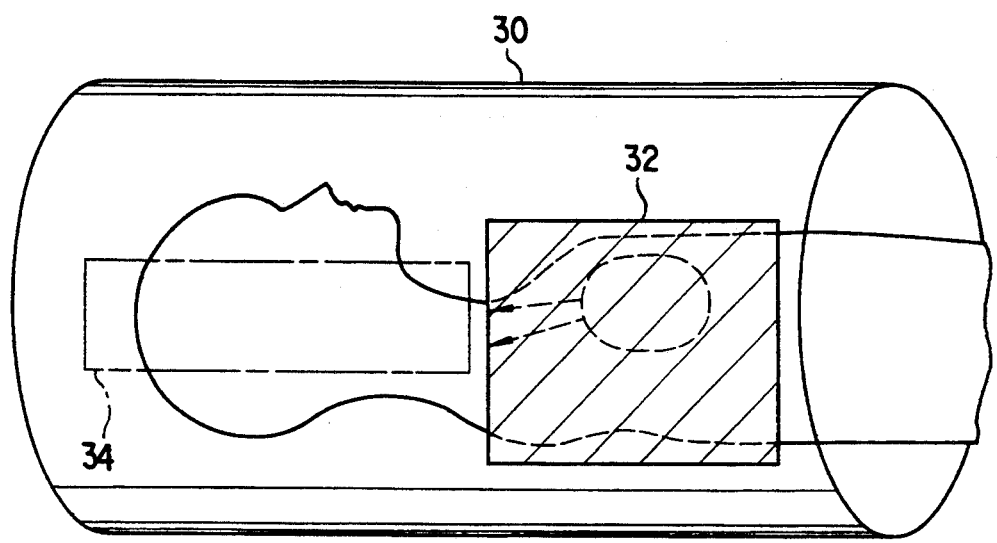
FIG. 4 is a view showing a modification of a transmitter/receiver coil of the embodiment.

The operation of this embodiment will be described. As described above, in this embodiment, since the coronal scheme is employed and a slice region along a blood vessel is selectively excited, even a blood flowing into the slice region is also undesirably excited. Therefore, as shown in FIGS. 3 and 4, the transmitter/receiver coil system 3 does not radiate a selective excitation pulse to the entire human body under examination, but selectively excites only a portion, e.g., the head and neck of the human body under examination. A region 34 indicated by a long and short dashed line in FIG. 3 and parallel to the body axis is an imaging region. As shown in FIG. 4, when a transmitter/receiver coil system 30 is not a coil only for the head and neck but a coil for half or the entire body, the non-imaging region (portion other than the head and neck) may be covered with, e.g., an RF shield mesh sheet 32 made of a non-magnetic material such as copper, so that a selective excitation pulse will not radiate into a region other than the imaging region 34, especially a region closer to the heart than the imaging region 34. When the RF shield sheet 32 is used, the half- or entire-body coil system 30 can be set equivalent to a head and neck coil system 3.

Then, the region 32 adjacent to the imaging region 34 including a blood vessel through which the blood flows toward the imaging region 34 (in this case, a region including the artery through which the blood flows toward the imaging region 34), i.e., the adjacent region 32 closer to the heart than the imaging region 34 is not excited, but only the imaging region 34 is excited, the spin in the arteries in the imaging region 34 is always maintained at a fresh state (unsaturated state), and the signal level of this spin can be set higher than that of the stationary spin remaining in the imaging region 34. In this case, the shorter the echo time, the larger the degree of decrease in signal level of the stationary spin. Therefore, according to the present invention, the image of only an artery can be formed without prolonging the echo time. Also, although a blood vessel that need not be imaged, i.e., the vein through which the blood flows toward the imaging region 34 is not particularly presaturated, if the imaging region is a peripheral portion, since the presaturated blood in the artery in the imaging region is returned at its peripheral portion to flow through the vein, the vein through which the blood flows toward the imaging region 34 has been presaturated, the spin in the vein is set in the saturated state, and a signal is scarcely generated by this spin. As a result, since deletion of the vein, i.e., application of an RF pulse only for presaturation of the vein need not be performed if the imaging region is a peripheral portion, the repetition time can be shortened, and the imaging time is shortened.

Since a slice region along the flowing direction of the artery is imaged, the number of imaging slices for blood vessel imaging is minimized. As a result, the imaging time can be shortened, and the post-processing time is also shortened.

Furthermore, since flow compensation need not be performed, the echo time is shortened to decrease the signal level of the stationary spin. Since the signal level of a signal generated by a fresh spin is not decreased, the signal level of the artery can be relatively increased.

In this manner, according to this embodiment, since a slice region along the flowing direction of the blood vessel is selectively excited, the number of imaging slices is minimized, the imaging time and post-processing time can be shortened, and the burden of the operator is decreased. Extraction of an artery image is enabled within a time (about 2 to 5 minutes) of about 1/5 that (about 12 to 15 minutes) required by the conventional TOF scheme. Furthermore, when the shape of the transmitter/receiver coil is determined not to presaturate the adjacent region of the imaging region including a blood vessel through which the blood flows toward the imaging region, or when the portion of the body under examination corresponding to the adjacent region of the imaging region including a blood vessel through which the blood flows toward the imaging region is covered with the RF shield sheet, a spin in the artery can be caused to flow into the imaging region in always a fresh state. When the imaging region is a peripheral portion of the body under examination, the blood in the vein can be saturated without being presaturated since it is excited in the artery in the imaging region. Since the signal level of the stationary spin can be decreased and the artery can be detected as a relatively high-level signal, excellent extraction of the artery image can be performed. Therefore, even a slightly bent blood vessel can be continuously imaged, and the image resolution and the reliability of the apparatus are improved.

As has been described above, according to the present invention, there is provided a magnetic resonance imaging apparatus capable of forming the image of only an artery within a short period of time.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, although the above description concerns the head and neck, the same applies to any other portion of a human body. Although a coronal scheme has been described as the pulse sequence, a sagittal scheme can be used in which an x-axis gradient field Gx, a y-axis gradient field Gy, and a z-axis gradient field Gz are used as a slice-selection gradient field Gs, a phase-encoding gradient field Ge, and a read-out gradient field Gr, respectively.

What is claimed is:

1. A magnetic resonance imaging apparatus comprising:
    means for setting a slice region along a direction of an artery as an imaging region;
    means for exciting only spins in the imaging region so that spins outside the imaging region and in a region including the artery through which blood flows toward the imaging region is not excited;
    means for receiving a magnetic resonance signal generated by the spin in the imaging region; and
    means for providing a magnetic resonance image in accordance with the magnetic resonance signal received by said receiving means.

2. An apparatus according to claim 1, wherein said exciting means comprises a radio-frequency coil, having a sensitivity only with respect to the imaging region, for generating a radio-frequency magnetic field and receiving the magnetic resonance signal.

3. An apparatus according to claim 1, wherein said exciting means comprises:
    a radio-frequency coil, having a sensitivity with respect to the imaging region and the region including the artery through which the blood flows toward the imaging region, for generating a radio-frequency magnetic field and receiving the magnetic resonance signal; and
    a shield member for surrounding a body under examination so as to shield the spins in the region including the artery through which the blood flows toward the imaging region from the radio-frequency magnetic field.

4. An apparatus according to claim 3, wherein said shield member comprises a mesh sheet made of a non-magnetic material.

5. An apparatus according to claim 1, wherein said setting means comprises means for generating x-, y-, and z-axis gradient fields respectively serving as phase-encoding, slice-selection, and read-out gradient fields.

6. A magnetic resonance imaging method comprising the following steps of:
    (a) defining a slice region parallel to a running direction of an artery as an imaging region;
    (b) exciting only the imaging region; and
    (c) detecting a magnetic resonance signal from the imaging region and forming an image of the artery.

7. A method according to claim 6, wherein the step (a) comprises a substep of applying an x- or y-axis gradient field to a body under examination as a slice-selection gradient field.

8. A method according to claim 6, wherein the step (b) comprises a substep of applying a radio-frequency pulse to a body under examination by using a transmitter coil covering only the imaging region of the body under examination.

9. A method according to claim 6, wherein the step (b) comprises a substep of applying a radio-frequency pulse to a body under examination by using a transmitter coil covering the imaging region and a region of the body under examination adjacent to the imaging region and including a heart while the region of the body under examination adjacent to the imaging region and including the heart is surrounded by a radio-frequency shield member.

* * * * *